(12) United States Patent
Dell et al.

(10) Patent No.: US 6,381,685 B2
(45) Date of Patent: *Apr. 30, 2002

(54) DYNAMIC CONFIGURATION OF MEMORY MODULE USING PRESENCE DETECT DATA

(75) Inventors: Timothy Jay Dell, Colchester; Mark William Kellogg, Essex Junction, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/750,521

(22) Filed: Dec. 28, 2000

Related U.S. Application Data

(63) Continuation of application No. 09/067,420, filed on Apr. 28, 1998, now Pat. No. 6,173,382.

(51) Int. Cl.[7] .............................................. G06F 12/00
(52) U.S. Cl. .......................... 711/170; 711/5; 711/170; 711/171; 711/172; 711/103; 711/115; 713/1; 713/2
(58) Field of Search .......................... 711/5, 170–172, 711/103, 115; 713/1, 2

(56) References Cited

U.S. PATENT DOCUMENTS

| | | | |
|---|---|---|---|
| 5,379,304 A | | 1/1995 | Dell et al. ................. 371/40.1 |
| 5,450,422 A | | 9/1995 | Dell ........................ 371/40.1 |
| 5,539,912 A | * | 7/1996 | Clarke, Jr. et al. ........... 710/104 |
| 5,715,207 A | * | 2/1998 | Cowell ................... 365/230.02 |
| 5,745,914 A | | 4/1998 | Connolly et al. ............ 711/105 |
| 5,937,423 A | * | 8/1999 | Robinson ................... 711/103 |

* cited by examiner

*Primary Examiner*—Do Hyun Yoo
*Assistant Examiner*—Mehdi Namazi
(74) *Attorney, Agent, or Firm*—William N. Hogg

(57) ABSTRACT

A memory module includes a plurality of memory chips on the module; first logic for configuring the memory module to operate in a selectable mode; second logic for storing initial presence detect (PD) data; and third logic for storing modified PD data that corresponds to a requested mode of operation of the memory module received from a system controller. The system checks the first logic to see if the mode is compatible with the system mode. If not, different PD data is written to and read from the third logic successively until a compatible mode is found or the available PD data is exhausted.

20 Claims, 3 Drawing Sheets

SYSTEM PROCESS

DIMM PROCESS

DYNAMIC CONFIGURATION OF MEMORY MODULE USING PRESENCE DETECT DATA

RELATED APPLICATIONS

This application is a continuation of patent application Ser. No. 09/067,420, filed Apr. 28, 1998, now U.S. Pat. No. 6,173,382 entitled "Dynamic Configuration of Memory Module Using Presence Detect Data".

This application is also related to U.S. application Ser. No. 09/067,549, filed Apr. 28, 1998, entitled "Address Re-Mapping for Memory Module Using Presence Detect Data" (Docket BU9-97-137); U.S. application Ser. No. 08/598,857, filed Feb. 9, 1996, entitled "High Density SIMM or DIMM with RAS Address Re-Mapping", Now U.S. Pat. No. 5,926,827 (Docket BU9-95-095); and U.S. application Ser. No. 08/582,010, filed Jan. 2, 1996, entitled "Method and Apparatus for Modifying Signals Received by Memory Cards", Now U.S. Pat. No. 6,035,370 (Docket BU9-95-057).

FIELD OF THE INVENTION

The invention relates generally to memory modules for computer systems. More particularly, the invention relates to techniques for system level negotiation of an operating mode of a memory module by dynamic control of the presence detect data.

BACKGROUND OF THE INVENTION

Computer memory comes in two basic forms: Random Access Memory (hereinafter RAM) and Read-Only Memory (hereinafter ROM). RAM is generally used by a processor for reading and writing data. RAM memory is volatile typically, meaning that the data stored in the memory is lost when power is removed. ROM is generally used for storing data which will never change, such as the Basic Input/Output System (hereinafter BIOS). ROM memory is non-volatile typically, meaning that the data stored in the memory is not lost even if power is removed from the memory.

Generally, RAM makes up the bulk of the computer system's memory, excluding the computer system's harddrive, if one exists. RAM typically comes in the form of dynamic RAM (hereinafter DRAM) which requires frequent recharging or refreshing to preserve its contents. Organizationally, data is typically arranged in bytes of 8 data bits. An optional 9th bit, a parity bit, acts as a check on the correctness of the values of the other eight bits.

As computer systems become more advanced, there is an ever increasing demand for DRAM memory capacity. Consequently, DRAM memory is available in module form, in which a plurality of memory chips are placed on a small circuit card, which card then plugs into a memory socket connected to the computer motherboard or memory carrier card. Examples of commercial memory modules are SIMMs (Single In-line Memory Modules) and DIMMs (Dual In-line Memory Modules).

In addition to an ever increasing demand for DRAM capacity, different computer systems may also require different memory operating modes. Present memories are designed with different modes and operational features such as fast page mode (FPM), extended data out (EDO), synchronous DRAM (SDRAM), double data rate SDRAM (DDR SDRAM), parity and non-parity, error correcting (ECC) and non error correcting, to name a few. Memories also are produced with a variety of performance characteristics such as access speeds, refresh times and so on. Further still, a wide variety of basic memory architectures are available with different device organizations, addressing requirements and logical banks. As a result, some memory modules may or may not have features that are compatible with a particular computer system.

In order to address some of the problems associated with the wide variety of memory chip performance, operational characteristics and compatibility with system requirements, memory modules are being provided with presence detect (PD) data. PD data is stored in a non-volatile memory such as an electrically erasable programmable read-only memory (EEPROM) on the memory module. A typical PD data structure includes 256 eight bit bytes of information. Bytes 0 through 127 are generally locked by the manufacturer, while bytes 128 through 255 are available for system use. Bytes 0–35 are intended to provide an in-depth summary of the memory module architecture, allowable functions and important timing information. PD data can be read in parallel or series form, but serial PD (SPD) is already commonly in use. SPD data is serially accessed by the system memory controller during boot up across a standard serial bus such as an I²C™ bus (referred to hereinafter as an I2C controller). The system controller then determines whether the memory module is compatible with the system requirements and if it is will complete a normal boot. If the module is not compatible an error message may be issued or other action taken.

It is desired, therefore, to provide a memory module that is more flexible in terms of its compatibility with different computer systems, and particularly that permits the computer system dynamically to negotiate available memory module functions and modes.

SUMMARY OF THE INVENTION

The present invention contemplates, in one embodiment, a memory module comprising: a plurality of memory chips on the module; first logic for configuring the memory module to operate in a selectable mode; second logic for storing initial presence detect (PD) data; and third logic for storing modified PD data that corresponds to a requested mode of operation of the memory module received from a system controller.

The invention also contemplates the methods embodied in the use of such a memory module, and in another embodiment, a method for system control of an intelligent-memory module, including the steps of:

a) reading initial presence detect (PD) data from a non-volatile memory on the memory module;

b) writing modified PD data to a volatile memory based on requested operating mode; and c) controlling transfer of the modified PD data between the memory module and a system controller based on which memory stores up-to-date PD data.

These and other aspects and advantages of the present invention will be readily understood and appreciated by

DETAILED DESCRIPTION OF THE INVENTION

Figure 1:
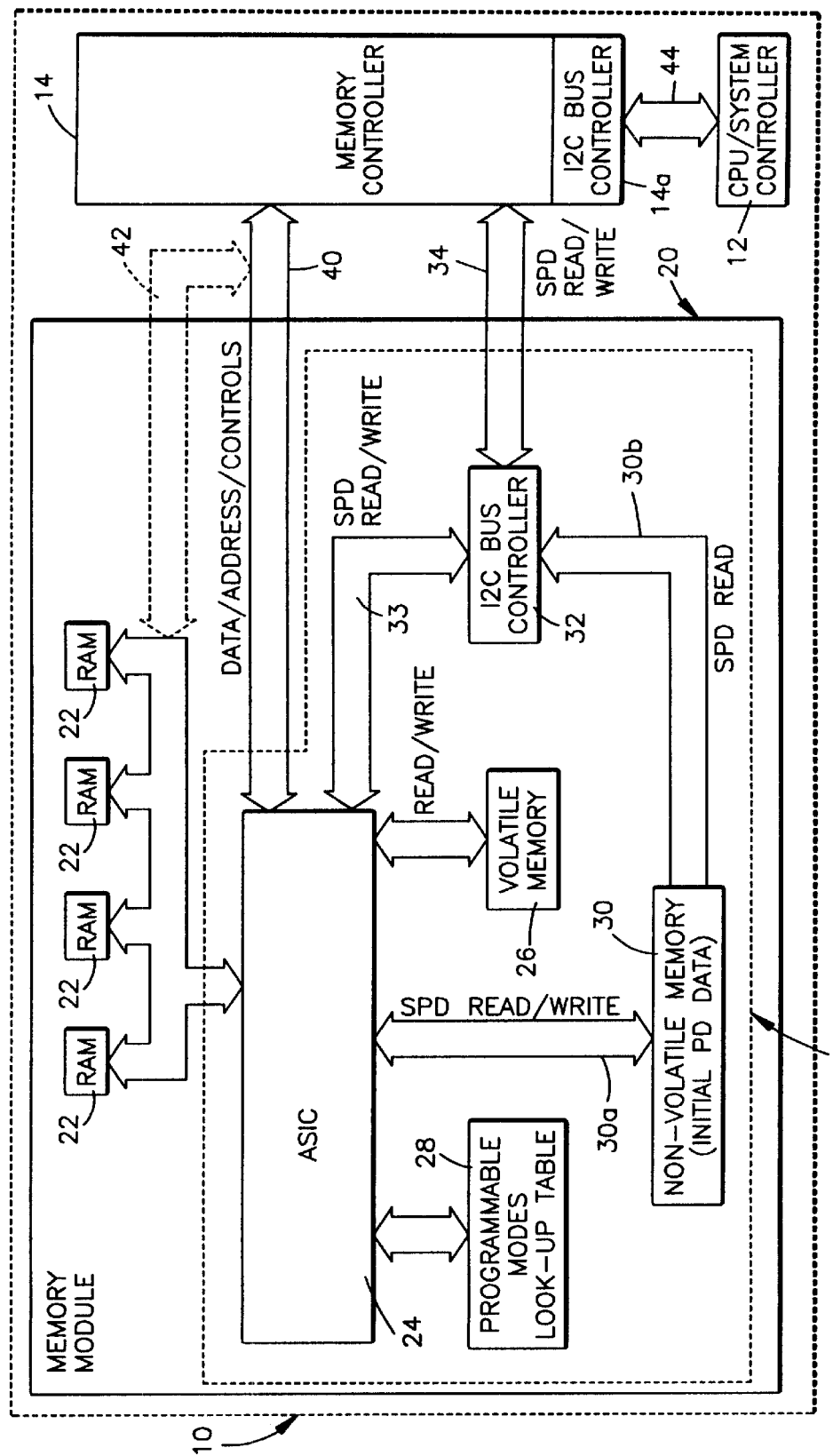
FIG. 1 is a functional block diagram of a memory module for a computer system in accordance with the present invention.

With reference to FIG. 1, an embodiment of the invention is illustrated in the environment of a computer system 10. The computer system 10 can be any computer system that utilizes a memory module having presence detect (PD) data and program able or selectable memory module functions and modes. Personal computer systems, such as an IBM APTIVA® or IBM PC-300™, could be used for the computer system 10, to name just two of many examples. The computer system includes a system controller 12, and a system memory controller 14. In this embodiment, the computer system 10 further includes a module 20, as will be further described hereinafter. The memory controller 14 provides address, data and bus control signals for interfacing the CPU 12 and the memory module 20. The memory controller 14 includes logic for addressing, receiving, writing and refreshing data in a plurality of memory chips 22 on the module 20. As will be apparent from the following exemplary embodiments, however, the memory module 20 may also include logic that interfaces with or otherwise controls various functions relating to addressing and data flow with the memory chips 22.

In accordance with one aspect of the invention, the memory module 20 is of the type that can be generally categorized as an "intelligent" module, in that the module 20 can operate in a plurality of selectable or programmable modes. The programmable feature of the module 20 is significantly advanced beyond the conventional mode selection criteria available by use of the Mode Register function of conventional memory chips such as synchronous DRAMs (SDRAMs). The memory module 20 can include memory chips such as, for example, SDRAMs with standard Mode Register functions such as, for example, burst type, burst length and CAS Latency. Such chips are used today on memory modules such as, for example, Dual Inline Memory Modules or DIMMs. Other module architectures such as SIMMS could also be used. However, these mode register functions alone do not provide the level of flexibility needed to allow system level control to optimally interface with a number of different memory chip 22 designs and memory module 20 capabilities.

In accordance with one aspect of the invention, the memory module 20 includes a logic circuit 24. In the embodiment, the logic device 24 is realized in the form of an application specific integrated circuit (ASIC). A suitable device for the ASIC 24 is a gate array ASIC such as TOSHIBA ASIC TC160G. Suitable SDRAM devices 22 are IBM 0316409CT3 available from IBM.

The ASIC 24 includes or communicates with a volatile memory 26. The volatile memory is used to store modified SPD data fields, as will be further explained herein.

The ASIC 24 further includes a look-up table 28 or comparable data set function that stores information about the programmable features of the memory module 20. The use of a logic circuit 24 provides the capability to include a number of system level programmable or selectable features or operating modes. For example, the ASIC 24 can be configured to allow the module 20 to operate in several addressing modes. In one embodiment, the ASIC 24 effects an address re-mapping operation. This allows the system controller 12, for example, to select or request an addressing option that is comparable with a mode available on the memory module 20. For example, SDRAM memories can include a number of banks of memory arrays. An ASIC can be configured to allow the use of a SDRAM in a system that supports only 2 bank SDRAMs, effecting an address re-mapping function. This example of a programmable or selectable feature for the memory module 20 is more fully described in co-pending U.S. patent application Ser. No. 09/067549 entitled "ADDRESS RE-MAPPING FOR MEMORY MODULE USING PRESENCE DETECT DATA" filed on even date herewith, the entire disclosure of which is fully incorporated herein by reference and which is owned in common by the assignee of the present invention.

Other examples of selectable or programmable modes and functions that can be negotiated and effected using the present invention include, for example, changing from an unbuffered to a buffered or registered mode, and engaging or bypassing FET switches (field effect transistor) to allow a DIMM to be connected or disconnected electrically from a bus.

In order for the system controller 12 to be able to take advantage of programmable modes in the memory module 20, the system controller 12 must be able to communicate with the module 20 to effect a mode request. In accordance with a significant aspect of the present invention, a technique is provided that allows the system controller 12 to negotiate an operating mode with the memory module 20.

In the described embodiment, this negotiation is effected by the use of the presence detect function of the memory module 20.

Memory modules that use SDRAMs typically include a presence detect (PD) function. A non-volatile memory such as an EEPROM is included on the DIMM and stores a PD data field. A typical PD data field includes 256 bytes of information which are further categorized into a number of segments as follows:

| BYTE NOS. | DATA |
| --- | --- |
| 0–35 | Module functional and performance information |
| 36–61 | Superset data |
| 62 | SPD Revision |
| 63 | Checksum for bytes 0–62 |
| 64–127 | Manufacturer's information |
| 128–255 | Reserved for system use |

The PD data in bytes 0–35 can be used by a system controller to verify compatibility of the memory module 20 and the system requirements. The PD data can be read in serial or parallel format. Although serial PD data (SPD) is used in the exemplary embodiments herein, those skilled in the art will appreciate that the invention can be used with parallel PD data.

The information contained in bytes 0–127 is generally locked by the manufacturer after completion of the module build and test. This ensures that the data is not corrupted or overwritten at a later time.

In the embodiment of FIG. 1, the system controller 12 accesses SPD data stored in a non-volatile memory 30. The non-volatile memory 30 may be a separate memory device such as an EEPROM, or may be a memory array that is part of the ASIC logic device 24. A suitable EEPROM with an integrated I2C bus controller (shown separately in the drawing for clarity) is a FAIRCHILD part no. NM24CO3L. The system controller 12 reads the SPD data stored in the non-volatile memory 30 (via a bus 30*b*) by accessing the memory 30 through a standard I2C bus controller 32 on the memory module 20 and the system memory controller 14 which includes a corresponding I2C controller 14*a*. The I2C bus 34 is an industry standard serial bus, and the I2C bus controller 32 can be, for example, a PHILLIPS part no. PCF8584 controller. The system I2C controller 14*a* may be located on the system mother board or integrated into the memory controller logic 14 as in FIG. 1. The system controller 12 accesses the memory controller 14 across a standard bus 44.

The memory controller 14 communicates with the module 20 via a DATA/ADDRESS AND CONTROL bus 40. This bus 40 can interface directly with the ASIC circuit 24 as illustrated, or can interface directly with the memory chips 22, as indicated by the phantom bus 42. Data flow typically is accomplished directly between the memory controller 14 and the memory chips 22, however, in some applications the ASIC may be used to modify addresses (e.g. as is done in the above incorporated pending application for address re-mapping), or also for data formatting features such as parity, error correction and so on to name a few examples.

The present invention thus is not limited in terms of how data and control signals are exchanged between the system and the module 20, but rather more generally to how the system can negotiate an operating mode of the module. Thus, although double ended arrows are used to represent data and control flow between the ASIC 24 and the memory chips 22, this is intended to be exemplary in nature. Those skilled in the art will appreciate that the particular architecture used will depend on the actual programmable features incorporated into the memory module 20. In some applications, for example, the ASIC 24 will send address and control signals to the memory chips 22, but the data will flow directly to the memory controller 14. The module I2C bus controller function can be and often is integrated with the non-volatile memory 30 and/or the ASIC device 24. In another example, the data, address and control signals will flow directly between the memory controller 14 and the memory chips 22, but the ASIC will provide other features or controls. Thus, the exact flow of signals will depend on each particular implementation, and the exemplary embodiment of FIG. 1 should not be construed in a limiting sense.

The ASIC 24 also has access to data in the non-volatile memory 30, via a bus 30*a*. This is provided so that the ASIC 24 can, in some applications, be used to re-write the original PD data in the non-volatile memory 30. Furthermore, in the case where the ASIC device 24 directs PD data to be read from the volatile memory 26, the appropriate control signal, such as the I2C clock, is simply withheld from the non-volatile memory 30 by the ASIC 24.

It is further noted that the various circuits indicated as discrete functional blocks, such as blocks 26, 28, 30 and 32 may be part of the overall ASIC device 24, as represented by the dashed box 24*a* around those components.

The system controller 12 initially obtains the SPD data from the non-volatile memory 30 during boot-up after the computer 10 is powered up. A power on reset (POR) operation occurs which resets the logic in the memory module 20 to ensure that the preset module operation mode is initiated using the initial or original SPD data stored in the non-volatile memory 30.

It is another aspect of the invention that the system 12 can originate a negotiation of memory module 20 functions or modes "on the fly", not just during a power on sequence. Although the embodiment described herein is explained in the context of a power on or boot up sequence, this is merely for convenience of explanation, and those skilled in the art will appreciate that the techniques and apparatus described herein allow the system 12 to negotiate a module 20 mode at any time by initiating a new SPD read/write operation.

In order to effect a negotiation between the system 12 and the memory module 20, it is preferred but not required that the system controller 12 be able to ascertain whether the module 20 includes programmable features. It is contemplated that one of the PD data bytes, such as byte 61 in the address range for "Superset" will be designated to indicate that the memory module 20 has one or more programmable features (such as, for example, address re-mapping). One reason that it may not be required to include programmable information in a PD data byte is that the system 12 can be designed to request a mode change if needed and the logic device 24 could simply accept or reject the request based on the features available on the module 20. The use of a byte such as byte 61 to indicate programmable features could speed up the negotiation process, particularly where the module 20 does not have programmable features.

Based on an initial PD data from the non-volatile memory 30, the system controller 12 can compare the module 20 performance and operational features with the system requirements. This comparison can be effected by the system BIOS as is known. If the module 20 is compatible with the system 12 requirements, normal boot up and operation follows. If, however, the module 20 has module or device functions that are inconsistent with the system level requirements, and if the PD data indicates that the module 20 has one or more programmable features, then a negotiation process can be executed by the system 12. Again, the latter requirement of an affirmative indication in the PD data of programmable features is not required in order to carry out the present invention but is a preferred embodiment.

A negotiation process between the system controller 12 and the module 20 can be implemented as follows. Based on the system requirements, the system controller 12 writes or transfers modified or requested PD data to the module 20. The modified PD data corresponds with a requested operating mode or function and can be transferred by a complete PD data field write of all 255 bytes, or alternatively the system controller 12 could write data for only the PD data entries that the system controller 12 desires to change. In either case, the modified PD data is generally transmitted to the logic device 24 by the memory, controller 14 and the I2C controller 32. The ASIC logic device 24 stores the modified PD data in the volatile memory 26. A volatile memory 26 can be used to store the new PD data because when power is removed it will be preferred to effect a start up sequence with the "original" or initial PD data in the EEPROM 30. Thus, it is further contemplated that for a system level negotiation, modified or requested PD data will not be written to the EEPROM 30 because it is desirable not to lose the original PD data therein. But, alternative techniques for preserving the original PD data while using the non-volatile memory 30 for the modified PD data, and then re-writing the original PD data back to the memory 30 could be implemented if needed, although such a process may not be feasible in some applications.

After receiving the modified or requested PD data from the system controller 12, the ASIC logic device 24 can compare the new PD data and its corresponding modes or functions, with permitted modes or functions that are supported by the ASIC device 24. The permitted functions can be obtained, for example, from the look-up table 28. This process does not require a "translation" per se of PD data to corresponding functions. For example, the ASIC device 24 can be provided with a look up table 28 or other suitable stored data format that indicates PD data values that it can support. The look-up table 28 may also store data that indicates various operational parameters of the memory chips, which data can be used to analyze additional compatibility features that might otherwise not be available from the conventional PD data and mode register functions.

In the case where the modified PD data corresponds to functions supported on the module 20, the modified or new PD data is saved in the volatile memory 26 and normal start-up and operation continues under the new mode or function. Thereafter, the ASIC logic device controls the transfer of PD data either from the non-volatile memory 30 or the volatile memory 26 depending on which memory holds the most up-to-date PD data for each PD data byte. The volatile memory 26 can be designed to store all the PD data field entries, in which case PD data transfer can occur from the volatile memory 26 alone. Alternatively, the volatile memory 26 can be used to store only the new up-to-date PD data entries, in which case the ASIC device 24 will use both the non-volatile memory 30 and the volatile memory 26 to transfer PD data to the system controller 12. In the latter case, it is contemplated that the ASIC device 24 will set a "flag" bit for each SPD address that is rewritten by the system 12. This bit can then be used to direct any future "SPD READ" operations to use the PD data contained in the volatile memory 26 for those addresses.

The system controller 12 may elect to verify that the new mode or function has been entered. In this case, the system performs a READ of the PD data to verify compatible functions are in use. In general, the system controller 12 would then initiate a power on self test (POST) to ensure the memory module 20 is fully functional.

In the event that the module 20 is not programmable or does not have requested programmable functions supported by the ASIC logic device 24, the system controller 12 will continue the boot up process with appropriate diagnostics or other initialization processes as normally occurs when incompatible memory devices are detected during power up.

Figure 2:
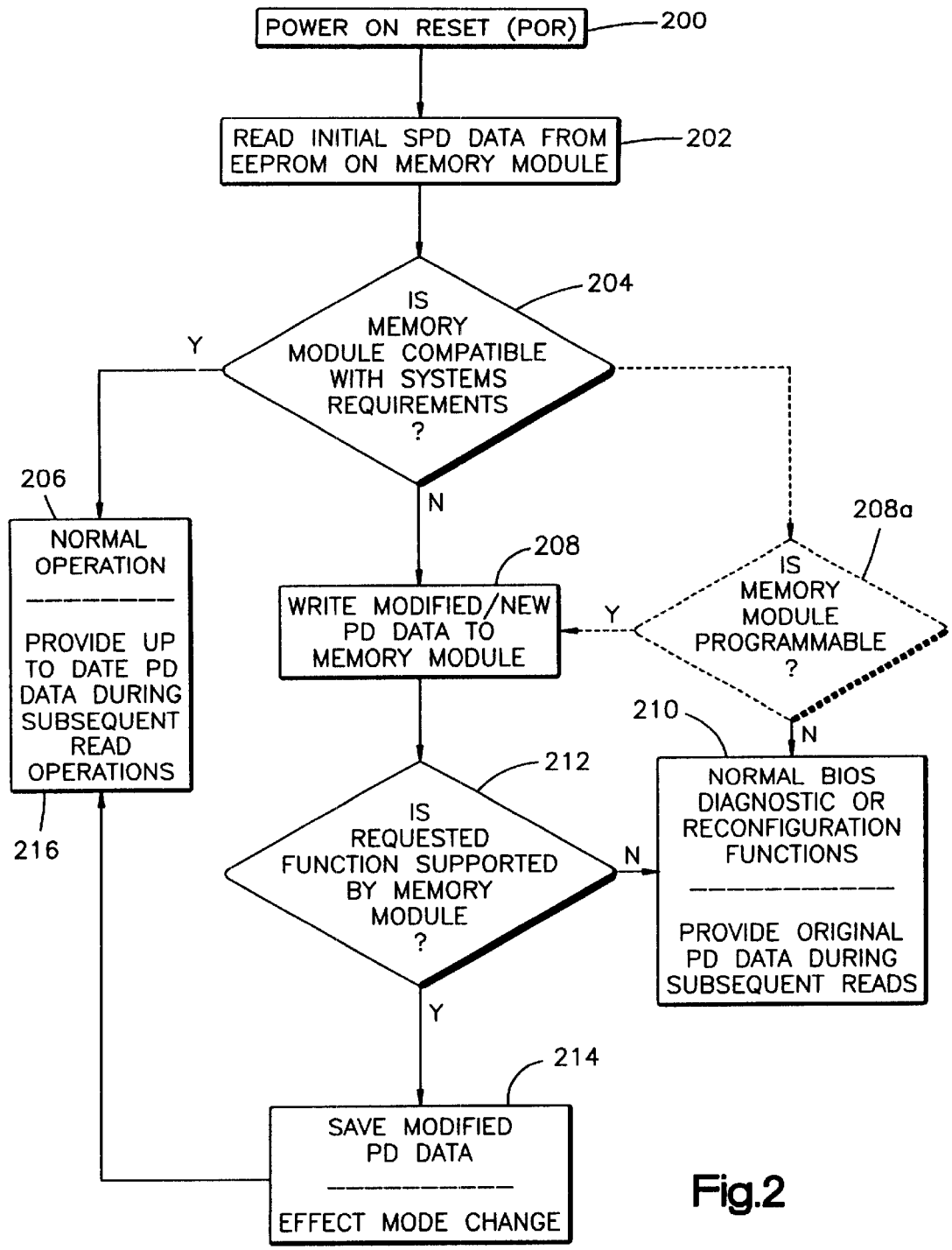
FIG. 2 is a flow chart for a negotiation process at the system level with a memory module using READ/WRITE PD data functions.

With reference to FIG. 2, a suitable control process in accordance with the invention is provided. At step 200 a POR sequence is performed to initialize the memory module 20. At step 202 the system controller 12 accesses the initial PD data stored in the non-volatile memory 30. In the described embodiment, step 202 is a serial PD READ operation via the I2C bus 34 and I2C-controller 32.

At step 204 the system controller 12 determines whether the initial operating modes and functions of the memory module 20 are compatible with system level requirements. If YES, normal operation continues at step 206. If NO, the system controller 12 at step 208 writes modified or new PD data to the memory module 2b, which new PD data is stored in the volatile memory 26. Shown in dashed lines on FIG. 2 is a related step 208a for systems wherein a PD data entry is used as a flag or marker to indicate to the system controller 12 whether the module 20 supports programmable functions or modes. If NO, the system enters its normal diagnostic and configuration functions at step 210 under control of the BIOS.

At step 212 the ASIC logic device 24 determines whether the requested function, as indicated by the modified PD data, is supported on the memory module 20. If YES, the up-to-date PD data is stored (step 214) and provided during subsequent READ operations (step 216) during normal operation (step 206). If the requested function is not supported by the memory module 20 as determined at step 212, the system enters the normal diagnostic/configuration functions at step 210, as is the case from step 208a if the module 20 is not programmable. Note that at step 214 the a requested mode change is also effected. It is at this point, for example, that the system may perform a self-test to verify that the requested change has been implemented.

Those skilled in the art will appreciate that the exemplary embodiment of FIG. 2 illustrates a negotiation process involving a single request step by the system controller 12. In accordance with another aspect of the invention, the negotiation process can include a number of exchanges between the system 12 and the ASIC 24 in an attempt to find a compatible set of operating parameters. This aspect of the invention assumes that the memory module includes programmable features.

Figures 3A, 3B:
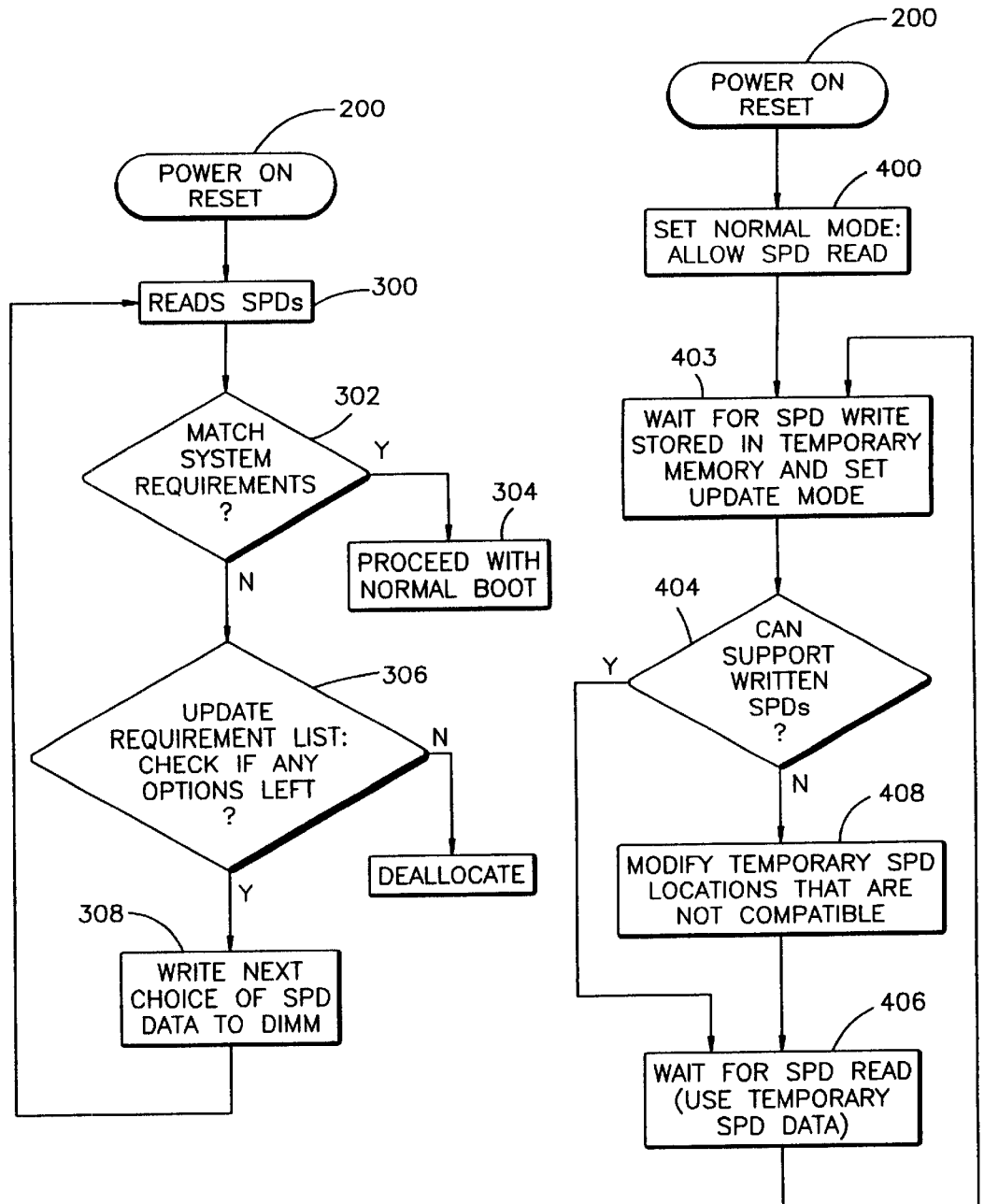
FIGS. 3A and 3B are flow charts illustrating another aspect of the invention pertaining to a multiple step negotiation process.

FIGS. 3A and 3B illustrate this aspect of the invention. FIG. 3A shows a suitable process flow for the system 12 and FIG. 3B shows a suitable process flow for the memory module 20, in particular the ASIC control 24. Note that the functions identified in FIG. 2 can also be incorporated as required for the alternative embodiment, with FIGS. 3A and 3B illustrating additional and/or alternative steps for carrying out a multiple step negotiation process.

In essence, the system controller 12 makes a number of attempts to find a compatible configuration within the programmable features of the DIMM. This is effected in the FIGS. 3A and 3B embodiment as follows. On the system 12 end (FIG. 3A), at step 300 the system 12 reads the serial presence detect data from the DIMM, through the bus controller 14a and the SPD READ/WRITE bus 34. If at step 302 the SPD data indicates that the memory module 20 is compatible with system requirements, then at step 304 normal boot proceeds. If the result at step 302 is negative, then the system 12, at step 306, updates its memory function requirements list and if no further options are available the system 12 will de-allocate and proceed to a diagnostic routine or operate under the final negotiated parameters if permitted. If at step 306 there are additional options, then the system writes at step 308 the next choice of SPD data to the memory module 20, in a manner, for example, as previously described herein before. After step 308 the system returns to step 300 to verify whether the latest requested SPD data has been successfully accepted by the DIMM.

On the DIMM side, as in FIG. 3B for example, one aspect of this embodiment is that not only does the ASIC 24 analyze the requested SPD data from the system 12 as written to and stored in the volatile memory 26, but if the requested data is not available the ASIC 24 can modify the data in the memory 26 based on its next available option as identified from its look-up table 28. The system 12 then reads this latest information (at step 300 in FIG. 3A) to determine if it is compatible. Thus, the negotiation process is dynamically implemented by the ASIC 24 and the system controller 12. The process flows of FIGS. 3A and 3B thus operate together, although they are illustrated for convenience as separate flow diagrams.

In FIG. 3B then, at step 400, the ASIC 24 sets the normal DIMM operating mode and permits an SPD read operation by the system 12. The ASIC 24 then waits for an SPD write operation at step 402 as will be effected by the system 12 from the process of FIG. 3A if the DIMM normal mode is not compatible with the system 12 requirements. If the DIMM can support the SPD request from the system 12, then at step 404 the program advances to step 406 and the memory module 20 operates under the new SPD parameters. If the result at step 404 is negative, then at step 408 the ASIC 24 writes modified SPD data to the volatile memory 26 and then at step 406 waits for the next SPD read by the system 12.

Thus the process of FIGS. 3A and 3B can continue until either a compatible set of parameters is negotiated, or until the system 12 and/or the DIMM 20 options (as stored in their respective look-up tables) are exhausted.

As an example of a multiple step negotiation process, a DIMM may have hard programmed operating functions such as a 100 megahertz clock, CL=3 and $T_{ac}$=5 nanoseconds ("100M/3/5"). The DIMM SPD support list (such as can be stored as part of the look-up table 28 for example) may indicate that the DIMM can accept different modes such as 125M/4/6 (i.e. 125 megahertz clock, CL=4 and $T_{ac}$=6), 125M/3/6, 100M/4/7, 100M/3/7, 83M/2/8, 66M/1/7 and so forth. On the other hand, the system 12 requirements list may include 100M/2/4.5, 100M/3/6.5, 83M/2/9, 66M/1/12 and so on. Thus the DIMM and system can exercise a multiple step negotiation process by which the ASIC and system scan their respective support lists and write modified PD data in an effort to find a compatible match.

The invention thus provides techniques for system level negotiation with a programmable memory module by using PD READ/WRITE functions.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

What is claimed is:

1. A memory module comprising: a plurality of memory chips on the module; first logic for configuring the memory module to operate in a selectable mode; second logic for storing initial presence detect (PD) data; and third logic for storing modified PD data that corresponds to a requested mode of operation of the memory module received from a system controller and wherein said second logic comprises a non-volatile memory and said third logic comprises a volatile memory; and further wherein a system controller operates to read the initial PD data and to write modified PD data to said volatile memory; said modified PD data corresponding to a requested operating mode of the memory module by the system controller; said first logic operating to accept said modified PD data when the requested operating mode is available in the memory module and write other modified PD data to said volatile memory when said request mode is not available.

2. The apparatus of claim 1 wherein said PD data is accessed with a serial bus controller that interfaces with the system controller.

3. The apparatus of claim 1 wherein said second logic comprises an EEPROM that stores original serial PD data.

4. The apparatus of claim 1 wherein said first logic comprises an ASIC (application specific integrated circuit) logic device and includes a non-volatile memory that stores original serial PD data.

5. The apparatus of claim 1 comprising an I2C bus controller and an I2C bus; said system controller reading serial PD data from a non-volatile memory after memory power up, and determining compatibility of memory module functions with system requirements.

6. The apparatus of claim 1 wherein said system controller writes the modified PD data to said volatile memory that corresponds to a desired operating mode of the memory module based on system requirements.

7. The apparatus of claim 6 wherein said first logic operates to accept said modified PD data when the corresponding requested mode is available in the module and writes modified SPD data (serial PD data) when the requested mode is not available, said first logic and a system controller operating to effect a dynamic negotiation of a compatible operating mode.

8. The apparatus of claim 1 comprising a serial bus and serial bus controller for interfacing a system controller with the memory module so that the system controller can read and write serial PD data of the memory module to negotiate an operating mode for the memory module.

9. A computer system comprising: a system controller and a memory module; the memory module comprising a plurality of memory chips on the module, and a memory module logic circuit for configuring the memory module to operate in a selectable mode; said system controller negotiating an operating mode of the memory module by reading and writing presence detect (PD) data of the memory module.

10. The computer of claim 9 comprising a serial bus controller for interfacing the memory module with the system controller; and wherein said system controller operates to read and write serial PD data of the memory module.

11. The computer of claim 9 wherein said memory module comprises a volatile memory that stores modified PD data written by said system controller that corresponds to a requested operating mode, and a non-volatile memory that stores initial PD data.

12. The apparatus of claim 11 wherein said memory module comprises a logic circuit that accepts said modified PD data when the requested operating mode is available in the memory module, and controls the transfer of PD data from said volatile and non-volatile memories based on which memory stores up-to-date data with respect to each PD data entry.

13. A method for system control of an intelligent memory module, comprising:
  a) reading initial presence detect (PD) data from a non-volatile memory on the memory module;
  b) writing modified PD data to a volatile memory based on requested operating mode; and
  c) controlling transfer of the modified PD data between the memory module and the system controller based on which memory stores the up-to-date PD data and wherein a logic circuit sets a flag for each PD data entry that is modified in response to a request for a programmable mode from the system controller.

14. The apparatus of claim 9 wherein said selectable mode comprises an address re-mapping function.

15. The method of claim 13 wherein said requested operating mode comprises an address re-mapping function.

16. The method of claim 13 comprising a multiple step negotiation between the system controller and the memory module by using both circuits to write the modified PD data to the volatile memory until a compatible mode is found or until support lists are exhausted.

17. A method for system control of an intelligent memory module wherein there is a pool of presence detect (PD) data in a computer system, comprising:
  a) reading initial presence detect (PD) data from a non-volatile memory on the memory module;
  b) determining if the presence detect (PD) data read from the non-volatile memory matches the system requirements;
  c) if a match, booting the computer system;
  d) if not a match, writing modified PD data from said pool of presence detect (PD) data to a volatile memory based on requested operating mode;
  e) reading the modified presence detect (PD) data in the volatile memory;
  f) if there is a match, booting the computer system;
  g) if there is not a match, repeating steps d) and e), repeatedly until there is a match or until there are no additional presence detect (PD) data in the pool to write.

18. The invention as defined in claim 17 wherein said pool of presence detect data is stored in one of said computer system or on said intelligent memory module.

19. The invention as defined in claim 17 wherein said pool of presence detect (PD) data is stored in both the computer system and said intelligent memory module.

20. The invention as defined in claim 19 wherein the presence detect data described in step g) is written alternately from the presence detect (PD) data in the system and on the intelligent memory module.

* * * * *